United States Patent

Kisoda et al.

[11] Patent Number: 6,089,186
[45] Date of Patent: Jul. 18, 2000

[54] VACUUM COATING FORMING DEVICE

[75] Inventors: Kinya Kisoda, Izumiohtsu; Eiji Furuya, Kishiwada; Ryoichi Ohigashi, Abiko, all of Japan

[73] Assignees: Chugai Ro Co., Ltd., Osaka; Dai Nippon Printing Co., Ltd., Tokyo, both of Japan

[21] Appl. No.: 09/394,505

[22] Filed: Sep. 13, 1999

[30] Foreign Application Priority Data

Feb. 1, 1999 [JP] Japan .................................. 11-023625

[51] Int. Cl.⁷ .................................................. C23C 16/00
[52] U.S. Cl. .................... 118/723 E; 118/723 R; 118/723 VE; 118/723 FE; 118/723 FI; 204/298.04; 204/298.05; 204/298.06; 204/298.36
[58] Field of Search ........................... 118/723 R, 723 E, 118/723 ER, 723 MP, 723 VE, 723 FE, 723 FI, 723 HC, 723 DC, 723 CB, 723 EB; 204/298.04, 298.05, 298.06, 298.36; 156/345

[56] References Cited

U.S. PATENT DOCUMENTS

| 3,562,141 | 2/1971 | Morley ........................................ 117/93 |
| 5,009,922 | 4/1991 | Harano et al. .............................. 427/37 |
| 5,368,676 | 11/1994 | Nagaseki et al. ........................ 156/345 |
| 5,413,663 | 5/1995 | Shimizu et al. .......................... 156/345 |
| 5,677,012 | 10/1997 | Sakemi et al. ............................ 427/523 |

Primary Examiner—Thi Dang
Assistant Examiner—Luz Alejandro

[57] ABSTRACT

The invention provides a vacuum coating forming device for forming a thin-film coating by a plasma beam on a substrate arranged in a vacuum chamber, the vacuum coating forming device being provided with a pressure gradient type plasma gun for generating the plasma beam toward the vacuum chamber and a converging coil which is provided so as to surround a short-tube portion of the vacuum chamber projecting toward an outlet of the plasma gun and which reduces a cross section of the plasma beam. This vacuum coating forming device further comprises an insulating tube provided at the outlet so as to surround the plasma beam and project in electric floating state, and an electron return electrode which surrounds the insulating tube within the short-tube portion and which is higher in electric potential than the outlet.

11 Claims, 10 Drawing Sheets

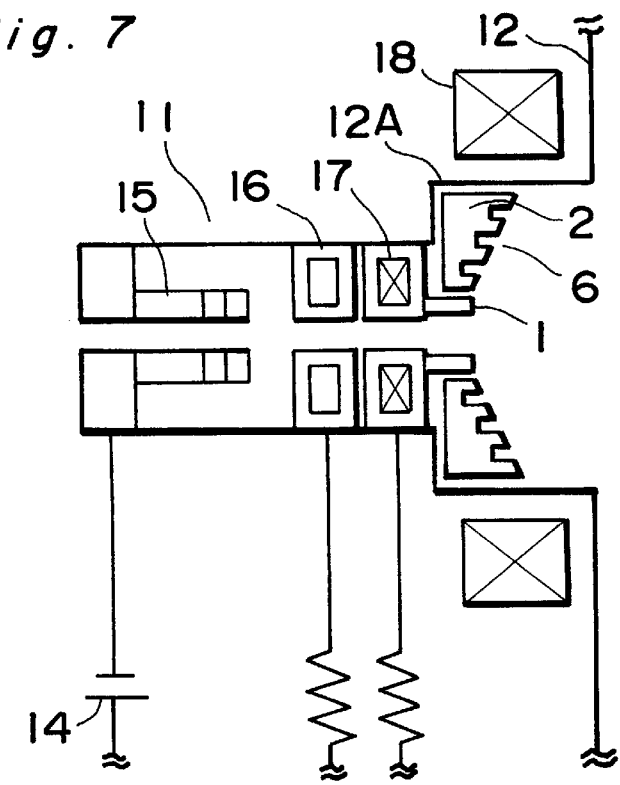
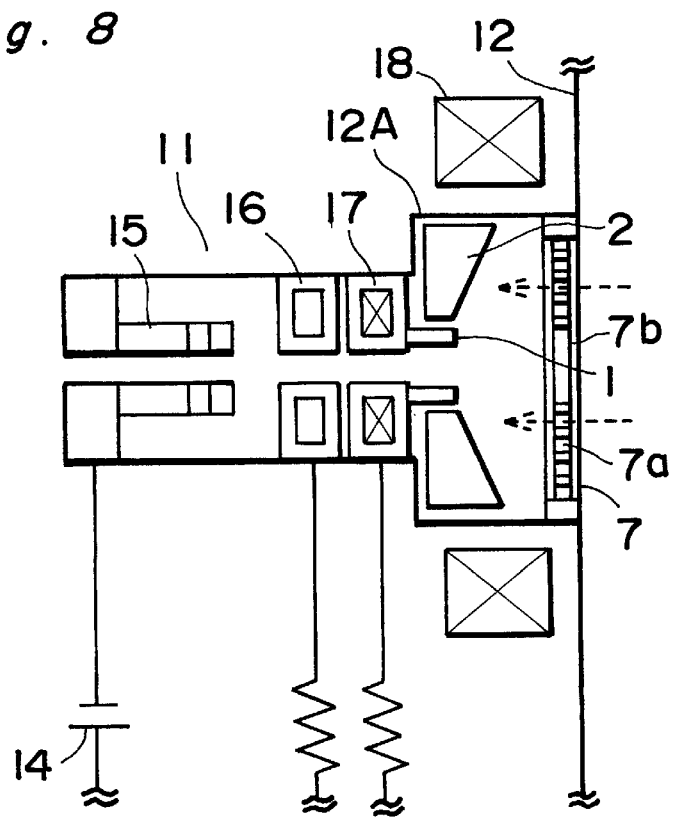

VACUUM COATING FORMING DEVICE

BACKGROUND OF THE INVENTION

1. Field of the Invention

The present invention relates to a vacuum coating forming device for forming on a substrate a thin-film coating made of an electrically insulating material.

2. Description of the Prior Art

As a vacuum coating forming device for forming on a substrate a thin-film coating of an electrically conductive material or an electrically insulating material, there have conventionally been known an ion plating apparatus as shown in FIG. 20 and a plasma enhanced CVD apparatus as shown in FIG. 21.

In the ion plating apparatus shown in FIG. 20, plasma is generated in a vacuum chamber 12 by a pressure gradient type plasma gun (hereinafter, referred to as plasma gun) 11, whereby a thin-film coating is formed on a substrate 13 placed in the vacuum chamber 12 by vapor deposition.

In more detail, the plasma gun 11 comprises an annular cathode 15 connected to the negative side of discharge power supply 14 and, annular first intermediate electrode 16 and second intermediate electrode 17 connected, respectively, to the positive side of the discharge power supply 14 via resistors, receiving the supply of discharge gas from the cathode 15 side, and setting the discharge gas in plasma state so as to deliver the discharge gas in plasma state from the second intermediate electrode 17 toward an inside of the vacuum chamber 12. The vacuum chamber 12 is connected to an unshown vacuum pump and the interior of the vacuum chamber 12 is held at a predetermined depressurized state. Furthermore, a converging coil 18 is provided outside a short-tube portion 12A of the vacuum chamber 12 projecting toward the second intermediate electrode 17 so as to surround the short-tube portion 12A. At a lower portion in the vacuum chamber 12, a hearth 19 is disposed which is connected to the positive side of the discharge power supply 14 and made of an electrically conductive material. A recession is formed on the hearth 19, in which an electrically conductive or insulating deposition material 20 used as a material of the thin-film coating is contained. In addition, a magnet 21 for the hearth 19 is provided within the hearth 19.

By this arrangement, a plasma beam 22 is formed so as to be directed from the second intermediate electrode 17 toward the deposition material 20, making the deposition material 20 evaporated and deposited onto the lower surface of the substrate 13, whereby a thin-film coating is formed. Meanwhile, the converging coil 18 functions to reduce a cross section of the plasma beam 22, while the magnet 21 for the hearth 19 functions to lead the plasma beam 22 to the hearth 19.

On the other hand, in the plasma enhanced CVD apparatus shown in FIG. 21, an anode 31 connected to the positive side of the discharge power supply 14, a magnet 32 for the anode 31 disposed behind the anode 31, i.e., on a side opposite to the plasma gun 11 side, and a material gas supply tube 33 are provided instead of the hearth 19, the deposition material 20 and the magnet 21 of the foregoing apparatus. Other constructions of the plasma enhanced CVD apparatus are substantially identical with the foregoing apparatus.

By this arrangement, material gas and reactive gas are supplied into the vacuum chamber 12 through the material gas supply tube 33, and these gases are separated from and combined with each other by plasma so as to be deposited onto the substrate 13, by which a thin-film coating is formed on the substrate 13.

In case of formation of a thin-film coating made of an electrically insulating material by using the conventional apparatuses shown in FIGS. 20 and 21, the insulating material adheres to the outer surface of the hearth 19 or anode 31 or the inner surface of the vacuum chamber 12 or the like, and in particular, the outer surface of the hearth 19 or anode 31 becomes electrically insulated. As a result, flow of electric current in the vacuum chamber 12 can not be maintained, so that the phenomenon that the electrodes are charged up at their various parts becomes marked as time elapses. Therefore, it becomes impossible to perform continuous and stable control for the plasma beam 22, causing a problem that the stability of coating formation is spoiled. Meanwhile, if such a phenomenon occurs, electrons incident on a portion where the flow of the electric current can not be maintained are reflected, and the reflection of electrons will be repeated until the electrons are electrically neutralized by combination with ions or until the electrons finally arrive at places where the electrons can be return electrically.

Further, since a magnetic field for controlling the plasma beam 22 is present in the vacuum chamber 12, the aforementioned reflected electrons, i.e., the motion of reflected electrons is restricted by this magnetic field. Accordingly, in order to form a thin-film coating made of insulation material continuously and stably by using the plasma gun 11, it is necessary to provide a proper return electrode for reflected-electrons at a position where an optimum state of magnetic field distribution is obtained and where an insulation coating is less likely to be deposited.

Unless the return path for reflected-electrons is urged to change, most of the reflected electrons tend to flow back in the path of the plasma beam 22 along this magnetic field under the effect of the magnetic field that controls the plasma beam 22. In other words, the plasma beam 22 and a beam by the reflected electrons reciprocate in the generally same path, whereas the reflected electrons is worse in convergency and smaller in acceleration voltage due to their reflection and scattering, compared with the electrons in the plasma beam 22.

Therefore, an electron beam incident on the return electrode for the reflected-electron needs to be separated from the plasma beam 22 delivered from the plasma gun 11. Without this separation, there would occur a plasma beam flowing directly into the return electrode for the reflected-electrons, so that the plasma beam reaching the deposition material side or the anode side would decrease in amount, resulting in a lowered efficiency of coating formation. Still more, direct discharge would further occur between the cathode 15 and the return electrode for the reflected-electron, making the discharge itself abnormal. The return electrode for the reflected-electrons is, preferably, provided at a position as far as possible from the portion in the vacuum chamber 12 where coating material is produced (position of the deposition material 20 in FIG. 20 or the gas outlet from the material gas supply tube in FIG. 21) from the viewpoint of preventing the deposition of the insulating material, and at a position as close as possible to the converging coil 18 from the viewpoint of reducing the device size.

SUMMARY OF THE INVENTION

An object of the present invention is to provide a vacuum coating forming device which is enabled to solve the above mentioned problems.

In order to achieve this object, according to the present invention, there is provided a vacuum coating forming device for forming a thin-film coating by a plasma beam on a substrate arranged in a vacuum chamber, the vacuum coating forming device comprising: a pressure gradient type plasma gun for generating a plasma beam toward inside a vacuum chamber; and a converging coil which is provided so as to surround a short-tube portion of the vacuum chamber projecting toward an outlet of the plasma gun and which reduces a cross section of the plasma beam, characterized by further comprising: an insulating tube provided within the short-tube portion so as to surround the plasma beam and project in electric floating state, and an electron return electrode which surrounds the plasma beam via the insulating tube within the short-tube portion and which is higher in electric potential than the outlet.

Since the electron return electrode is provided at a position distant from the deposition material or the gas outlet as shown above, the insulative material is less likely to be deposited onto the electron return electrode so that the occurrence of abnormal discharge between the cathode and the electron return electrode is prevented. Therefore, a reflected-electron flow reaching the electron return electrode along the path separated from the plasma beam outside the plasma beam is formed, so that the plasma beam is maintained continuously and stably. The duration of this maintenance remarkably increases at least twice that of case where the insulating tube and the electron return electrode are not provided. Further, the insulating tube is provided to prevent the occurrence of abnormal discharge, so that electric power loss due to inflow of the plasma beam into the electron return electrode is decreased. As a result, it also becomes possible to improve the coating forming rate under the same condition of the plasma beam derived from the plasma gun. In addition, since the electron return electrode is provided at a position near the converging coil, it becomes easier to make the device in small size.

Furthermore, according to the present invention, there is provided a vacuum coating forming device for forming a thin-film coating by a plasma beam on a substrate arranged in a vacuum chamber, the vacuum coating forming device comprising: a pressure gradient type plasma gun for generating a plasma beam toward an inside of a vacuum chamber, and a converging coil which is provided so as to surround a short-tube portion of the vacuum chamber projecting toward an outlet of the plasma gun and which reduces a cross section of the plasma beam, characterized by further comprising: an insulating tube provided in the short-tube portion so as to surround the plasma beam and project in electric floating state; a first electron return electrode which surrounds the insulating tube within the short-tube portion and which is higher in electric potential than the outlet; and a second electron return electrode which is provided in a space distant from the plasma beam and which is equal in electric potential to the first electron return electrode.

Since the first electron return electrode is provided so as to surround the short-tube portion and the second electron return electrode is provided in a space distant from the plasma beam as shown above, the insulating material is less likely to be deposited on the hearth or anode, thus preventing the occurrence of abnormal discharge between the first and second electron return electrodes. As a result, the above-described effects of the present invention become more remarkable. Further, since the electrons that have scattered out of the reflected-electron flow are captured by the second electron return electrode, the ratio of currents feeding back to both the first electron return electrode and the second electron return electrode to the effective discharge current to the hearth or anode can be made to be a value approximate to 100%, enabling an improvement in the coating forming rate.

BRIEF DESCRIPTION OF THE DRAWINGS

These and other objects and features of the present invention will become apparent from the following description taken in conjunction with the accompanying drawings in which:

FIG. 7 shows only a plasma gun and a short-tube portion of a vacuum chamber as well as their vicinities in a vacuum coating forming device according to a fifth embodiment of the present invention;

FIG. 8 shows only a plasma gun and a short-tube portion of a vacuum chamber as well as their vicinities in a vacuum coating forming device according to a sixth embodiment of the present invention;

DETAILED DESCRIPTION OF THE INVENTION

Embodiments of the present invention are described below with reference to the accompanying drawings.

Figure 1:
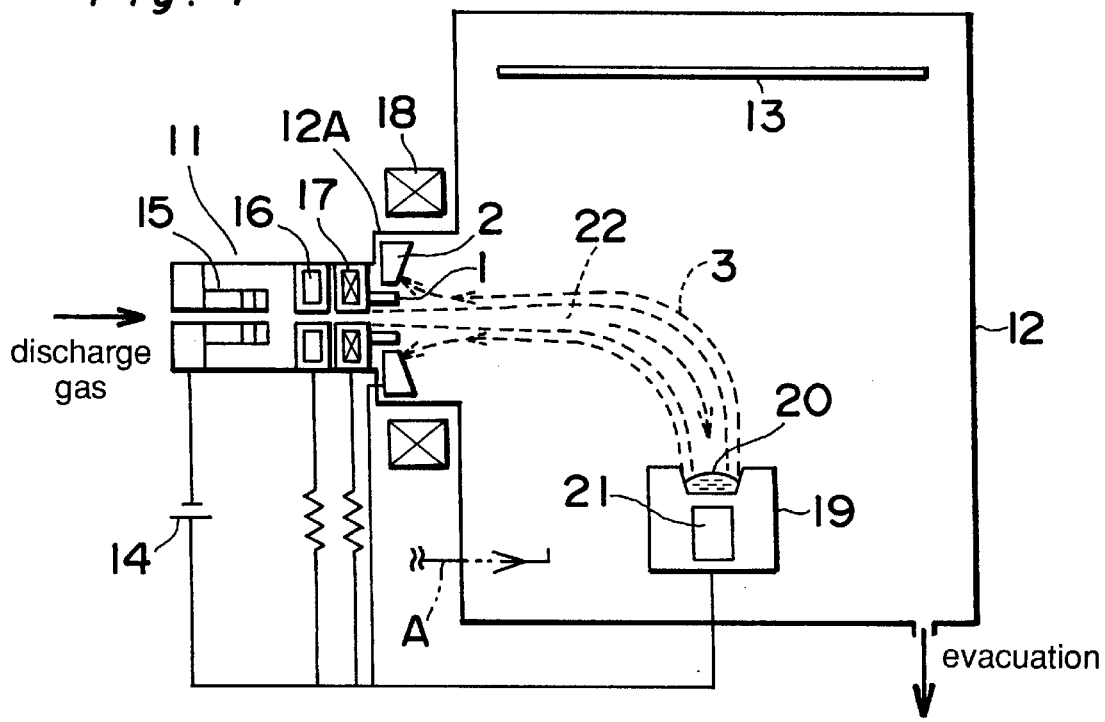
FIG. 1 schematically shows a vacuum coating forming device employing an ion plating system according to a first embodiment of the present invention.
Figure 20:
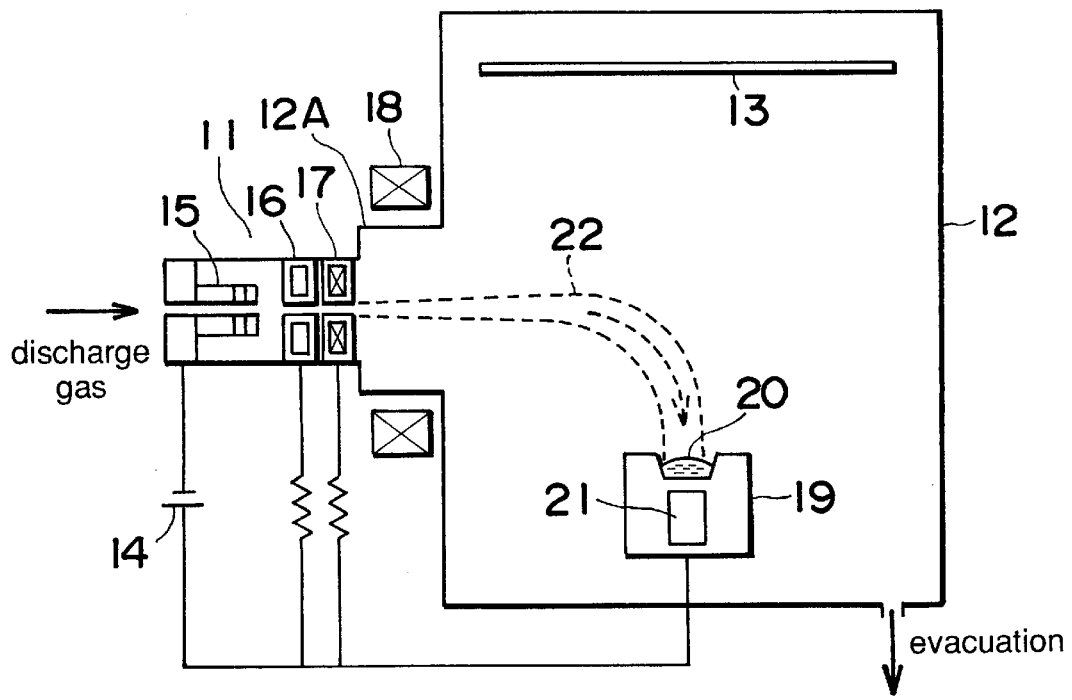
FIG. 20 schematically shows a vacuum coating forming device employing an ion plating system according to the prior art.

FIG. 1 shows a vacuum coating forming device employing an ion plating system according to a first embodiment of the present invention. In FIG. 1, parts substantially identical with those of the device of FIG. 20 are designated by the same reference numerals and their description is abbreviated.

This vacuum coating forming device is provided with an insulating tube 1 and an electron return electrode 2. The insulating tube 1 is provided at an outlet of a pressure gradient type plasma gun 11 so as to surround a plasma beam 22 and to project in electrical floating state. The electron return electrode 2 surrounds the insulating tube 1 within a short-tube portion 12A of a vacuum chamber 12 and is connected to the positive side of discharge power supply 14 so as to become higher in electric potential than an outlet of the plasma gun 11. A deposition material 20 in a hearth 19 is an insulating material. In addition, a ceramic short tube, for example, can be adopted as the insulating tube 1.

As described above, in this vacuum coating forming device, the electron return electrode 2 is provided at a position distant from the deposition material 20, so that adhesion of insulating material evaporated from the insulating deposition material 20 to the electron return electrode 2 becomes difficult. Further, the insulating tube 1 is provided between the plasma beam 22 emitted from the plasma gun 11 and the electron return electrode 2 so as to isolate them from each other, so that the incidence of the plasma beam 22 on the electron return electrode 2 and the occurrence of abnormal discharge between the cathode 15 and the electron return electrode 2 are prevented. Thus a reflected-electron flow 3 reaching the electron return electrode 2 is formed along a path outside the plasma beam 22 and separate from the plasma beam 22, whereby the plasma beam 22 is maintained continuously and stably. Meanwhile, it has been verified that this duration period remarkably increases to at least twice that of a case where the insulating tube 1 and the electron return electrode 2 are not provided. Further, it has been verified that, as a result of providing the insulating tube 1 to prevent the occurrence of abnormal discharge and thereby decrease the electric power loss due to inflow of the plasma beam 22 into the electron return electrode 2, it has been verified that the coating formation rate (material evaporation amount) is improved by about 20% under the same conditions of plasma beam 22 irradiated from the plasma gun 11. Furthermore, since the electron return electrode 2 is disposed near the converging coil 18, it becomes easy to make the device in small size.

Figure 2:
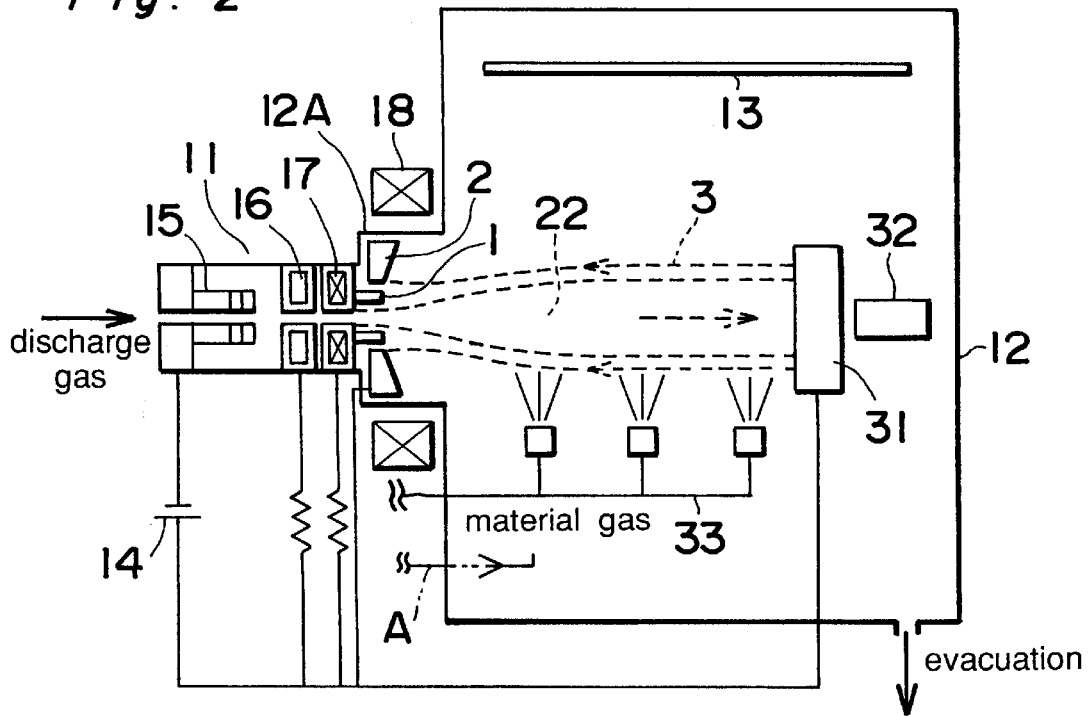
FIG. 2 schematically shows a vacuum coating forming device employing a plasma enhanced CVD system according to a second embodiment of the present invention.
Figure 21:
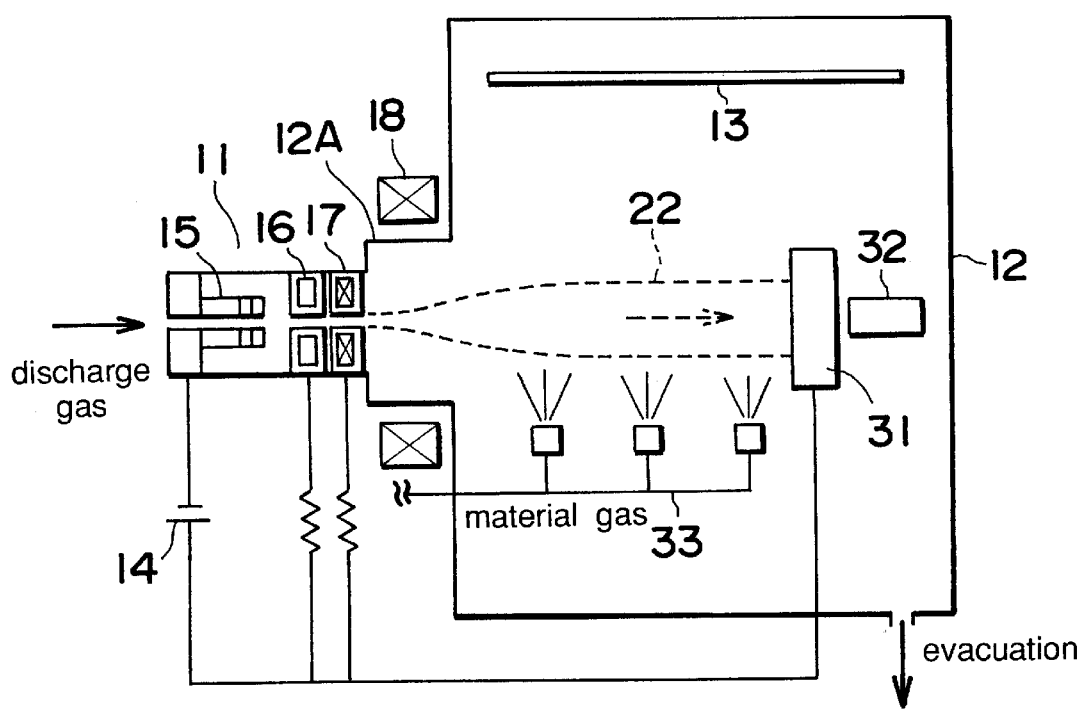
FIG. 21 schematically shows a vacuum coating forming device employing a plasma enhanced CVD system according to the prior art.

FIG. 2 shows a vacuum coating forming device employing a plasma enhanced CVD system according to a second embodiment of the present invention. In FIG. 2, parts substantially identical with those of the device of FIGS. 1 and 21 are designated by the same reference numerals and their description is is abbreviated.

This vacuum coating forming device, like the foregoing vacuum coating forming device shown in FIG. 1, is provided with an insulating tube 1 and an electron return electrode 2. By this arrangement, as in the first embodiment, a reflected-electron flow 3 reaching the electron return electrode 2 along a path separated from the plasma beam 22 outside the plasma beam 22 is formed, so that the plasma beam 22 is maintained continuously and stably and, the coating formation rate also increases. Besides, since the electron return electrode 2 is disposed at a position near the converging coil 18, it becomes easy to make the device in small size.

Figure 3:
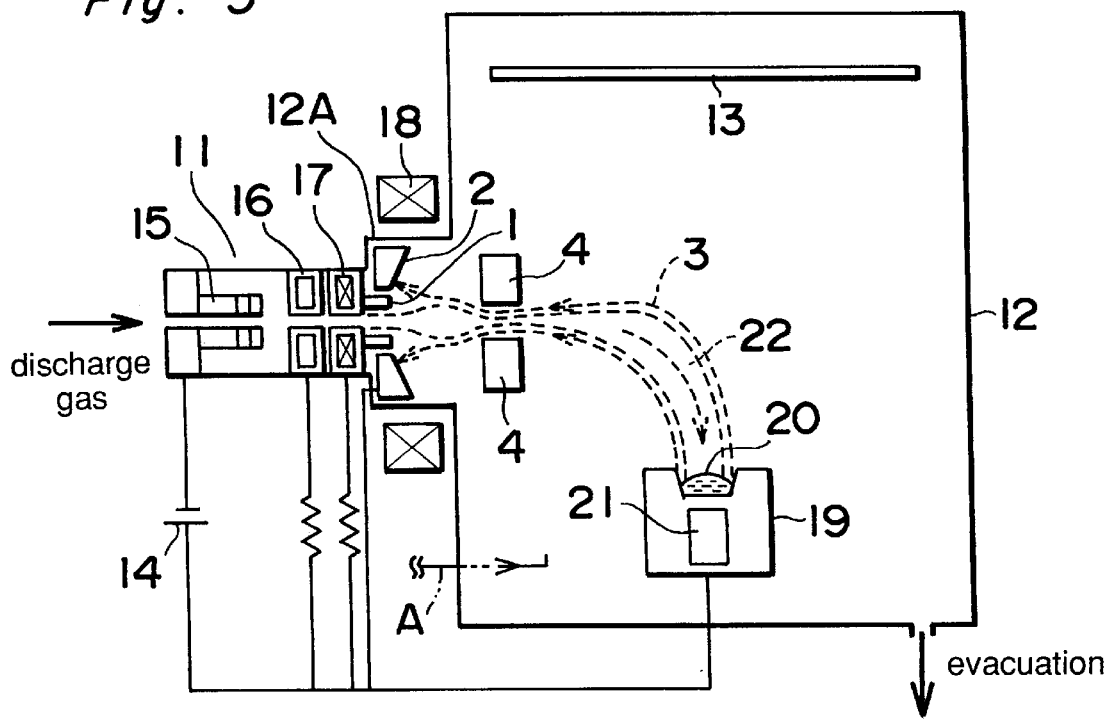
FIG. 3 schematically shows a vacuum coating forming device employing an ion plating system according to a third embodiment of the present invention.
Figure 4:
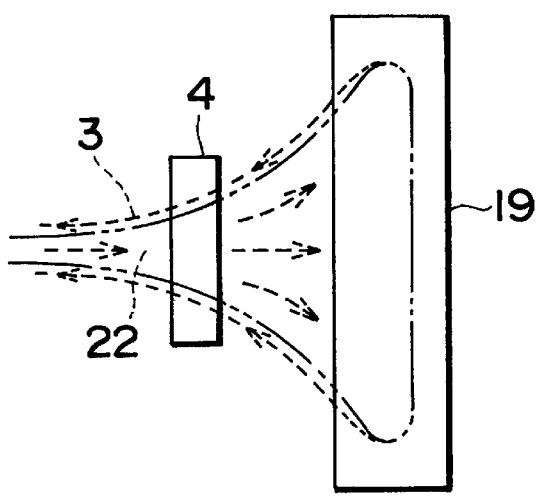
FIG. 4 shows a state of a plasma beam in the vicinity of sheet magnets in the device shown in FIG. 3.

FIGS. 3 and 4 show a vacuum coating forming device employing an ion plating system according to a third embodiment of the present invention. In FIGS. 3 and 4, parts substantially identical with those of the device of FIG. 1 are designated by the same reference numerals and their description is abbreviated.

In this vacuum coating forming device, a pair of sheet-like magnets 4, 4 are provided in front of the insulating tube 1 and the electron return electrode 2, i.e., on a side opposite to the plasma gun 11 such that poles (N poles or S poles) of the magnets 4, 4, which have an identical polarity, oppose to each other, whereby a cross section of the plasma beam 22 is constricted from both sides.

Thus, a plasma beam 22 that is incident on the deposition material 20 is made into a sheet-like shape so that a broader evaporation source is formed. As a result, this device permits substrates of larger breadths to be applied.

In addition, it is possible to apply these sheet-like magnets 4, 4 also in the vacuum coating forming device employing the plasma enhanced CVD system shown in FIG. 2. Applying these sheet-like magnets 4, 4 allows the same effects as described above to be obtained.

FIGS. 5 to 11 show only a plasma gun 11 and a short-tube portion 12A of a vacuum chamber 12 as well as their vicinities in vacuum coating forming devices according to fourth to ninth embodiments of the present invention. In FIGS. 5 to 11, parts common to those of the foregoing devices are designated by the same reference numerals and their description is abbreviated.

These constitutions shown in FIGS. 5 to 11 are applicable to both the ion plating system and the plasma enhanced CVD system, and constitutions of unshown other portions are substantially identical with those of the vacuum coating forming device shown in FIG. 1 or 2.

Figure 5:
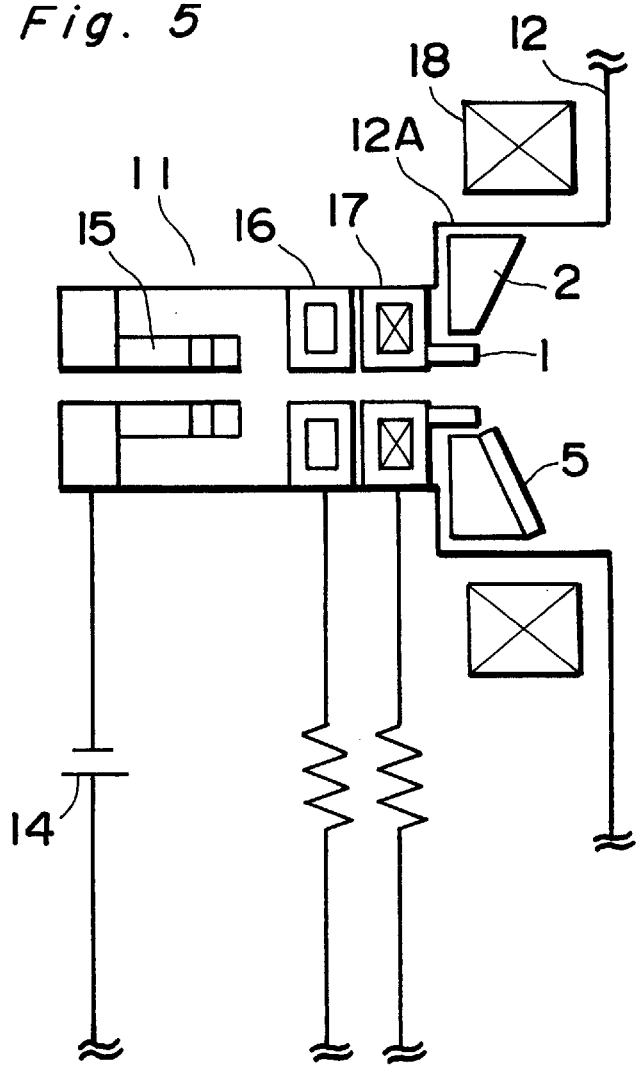
FIG. 5 shows only a plasma gun and a short-tube portion of a vacuum chamber as well as their vicinities in a vacuum coating forming device according to a fourth embodiment of the present invention.
Figure 6:
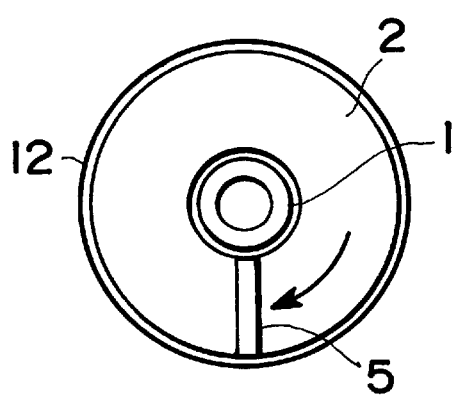
FIG. 6 is a view of the electron return electrode of FIG. 5, as viewed from the front side.

In FIGS. 5 and 6, on the electron return electrode 2, there is provided a rotary wiper 5 which wipes off and removes deposits, particularly insulating material, on the surface of the electron return electrode 2. As a result, the surface of the electron return electrode 2 can be maintained in a good condition for returning reflected electrons for a long time period.

In FIG. 7, a surface 6 of the electron return electrode 2 on a side directed toward the front side of the plasma gun 11 is formed into a corrugated shape. Thus, surface area for returning reflected electrons is increased.

In FIG. 8, a number of through-hole portions 7a are provided scattered uniformly all over an opening portion of the short-tube portion 12A of the vacuum chamber 12 inside the vacuum chamber 12, for example in a latticed pattern, while a baffle plate 7 having an aperture 7b for the plasma beam 22 at a center portion is located. Thus, the amount of gaseous insulating material that reaches the surface of the electron return electrode 2 is decreased. Meanwhile, this baffle plate 7 can also be applicable together with the wiper 5 or applicable to a vacuum coating forming device having the corrugated surface 6.

By these arrangements shown in FIGS. 5 to 8, the same effects as in the foregoing first embodiment can be obtained and, besides, an even more continuous and stable discharge can be achieved.

Figure 9:
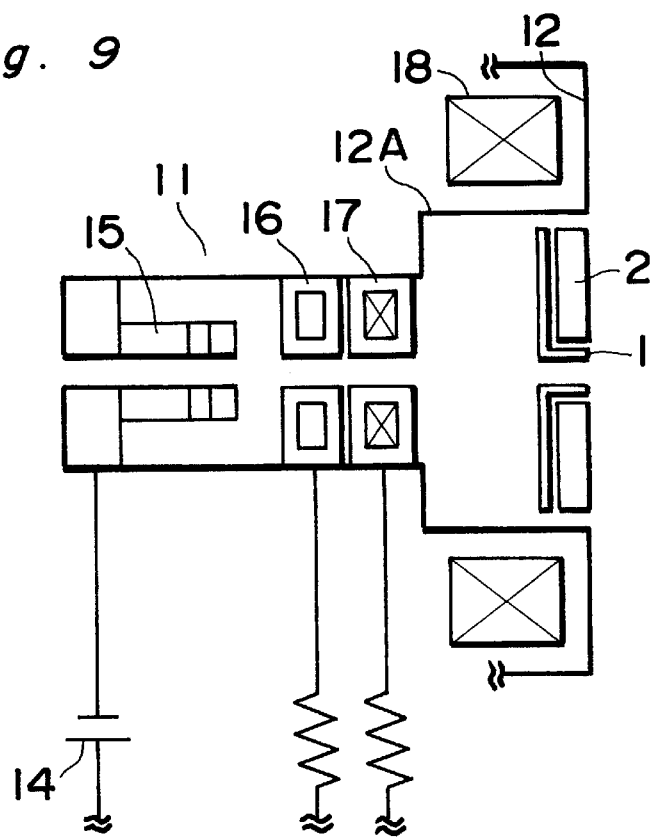
FIG. 9 shows only a plasma gun and a short-tube portion of a vacuum chamber as well as their vicinities in a vacuum coating forming device according to a seventh embodiment of the present invention.

The present invention is not limited to the aforementioned embodiments with respect to the position and cross-sectional shape of the electron return electrode 2 or the insulating tube 1. Each of them may be provided at any position which is disposed in the short-tube portion 12A so as to surround the plasma beam 22. For example, as shown in FIG. 9, the electron return electrode 2 and the insulating tube 1 may be located so as to be biased up to a limit within the short-tube portion 12A toward the inside of the vacuum chamber 12. Furthermore, with respect to the cross-sectional shape, in this example shown in FIG. 9, preferably, the electron return electrode 2 has a rectangular cross section and the insulating tube 1 is formed into a cylindrical shape having a flange on the plasma gun 11 side.

By these arrangements, reflected electrons can be captured even more efficiently.

Figure 10:
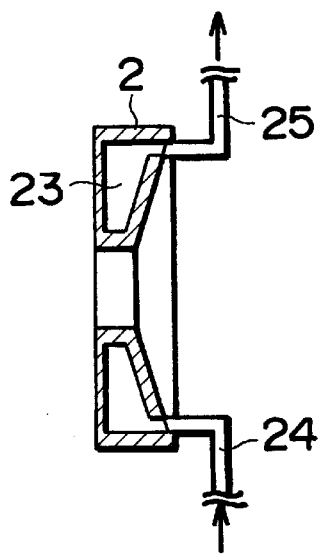
FIG. 10 shows an electron return electrode of a vacuum coating forming device according to an eighth embodiment of the present invention.

FIG. 10 shows an electron return electrode 2 of water cooling structure. In this case, a water-cooling jacket 23 is formed within the electron return electrode 2, where a cooling-water inflow tube 24 is connected to an inlet of the water-cooling jacket 23 and a cooling-water outflow tube 25 is connected to an outlet of the water-cooling jacket 23.

Figure 11:
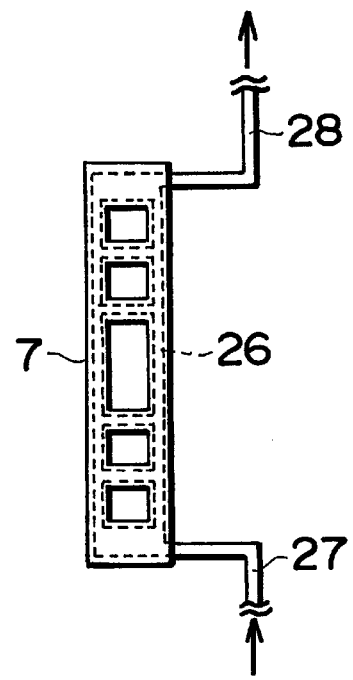
FIG. 11 shows a baffle plate of a vacuum coating forming device according to a ninth embodiment of the present invention.

FIG. 11 shows a baffle plate 7 of water cooling structure. In this case, a water-cooling jacket 26 is formed in the baffle plate 7, where a cooling-water inflow tube 27 is connected to an inlet of the water-cooling jacket 26 and a cooling-water outflow tube 28 is connected to an outlet of the water-cooling jacket 26.

By such an arrangement, the same effects as in the foregoing embodiments can be obtained and, besides, it becomes possible to suppress temperature increases in the electron return electrode 2 and the baffle plate 7, respectively, so that allowable input discharge power can be increased, resulting in improvement of the coating formation rate.

In the embodiments described above, the insulating tube 1 may be made of either an electrically conductive material or insulating material if it is held in electric floating state.

Further, although the deposition material 20, in the above description, is an insulating material, this deposition material 20 may be an electrically conductive material if this deposition material 20 is changed into an insulating material by combining with reactive gas. In this case, however, it is necessary to provide a reactive gas supply line for supplying reactive gas into the vacuum chamber 12 as shown by two-dot chain line A in FIGS. 1, 2 and 3, and to electrically shield the hearth 19 or the anode 31 from the discharge power supply 14. Meanwhile, if the deposition material 20 is an insulating material, the electrical shielding of the hearth 19 or the anode 31 from the discharge power supply 14 is not necessarily required.

Figure 12:
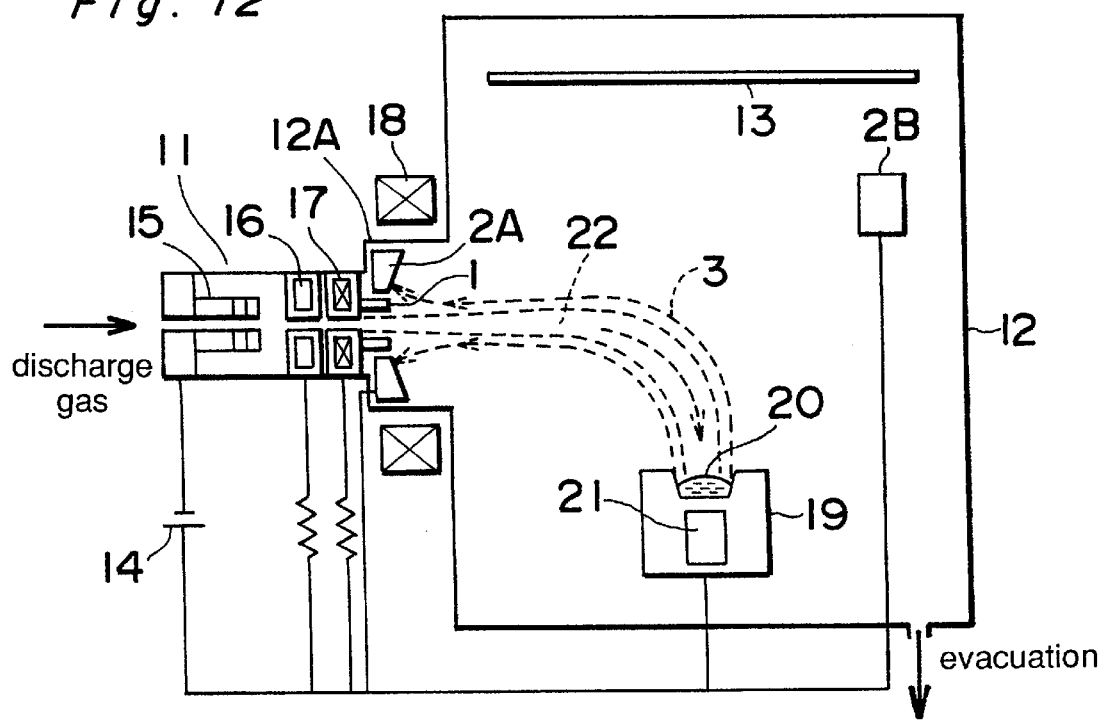
FIG. 12 schematically shows a vacuum coating forming device employing an ion plating system according to a tenth embodiment of the present invention.

FIG. 12 shows a vacuum coating forming device employing an ion plating system according to a tenth embodiment of the present invention. In FIG. 12, parts substantially identical with those of the device of FIG. 1 are designated by the same reference numerals and their description is abbreviated.

In this vacuum coating forming device, a first electron return electrode 2A in a higher potential state than an outlet portion of the plasma gun 11 is provided so as to surround the insulating tube 1 within the short-tube portion 12A of the vacuum chamber 12 and is connected to the positive side of the discharge power supply 14. On the other hand, a second electron return electrode 2B of the same potential as the first electron return electrode 2A is provided in a space not only at a side of a vertical extending through the deposition material 20, remote from the plasma gun 11, but nearer to the substrate 13 than the deposition material 20 between the deposition material 20 and the substrate 13.

Thus, in this vacuum coating forming device, since the first electron return electrode 2A and the second electron return electrode 2B are provided at positions distant from the deposition material 20, it becomes difficult that insulating material evaporated from the insulating deposition material 20 is deposited onto the first electron return electrode 2A and the second electron return electrode 2B. In addition, the insulating tube 1 is provided between the plasma beam 22 emitted from the plasma gun 11 and the first electron return electrode 2A so as to shield them from each other, preventing the plasma beam 22 from coming incident on the first electron return electrode 2A causing occurrence of abnormal discharge between the cathode 15 and the first electron return electrode 2A. As a result, a reflected-electron flow 3 reaching the first electron return electrode 2A is formed along the path separated from the plasma beam 22 outside the plasma beam 22, so that the plasma beam 22 is maintained continuously and stably. It has been verified that this duration period remarkably increases to more than twice that of a case in which the insulating tube 1 and the electron return electrode 2A are not provided.

If the second electron return electrode 2B is not provided, it is an ideal state that the ratio of a current flowing through the first electron return electrode 2A, i.e., the reflected-electron flow 3 to an effective discharge current flowing through the deposition material 20 by the plasma beam 22 becomes 100%. However, in case only the first electron return electrode 2A is provided, this actual ratio does not necessarily become a sufficient value, and the shortage ratio to 100%, i.e., the difference between the actual ratio and 100% constitutes an obstacle to improvement of the coating formation rate on the substrate 13. Therefore, with a view to obtaining a ratio approximate to 100% as much as possible, behavior of return electrons when only the first electron return electrode 2A was provided was investigated. As a result, it was proved that part of electrons reflected on the hearth 19 side collide with the plasma beam 22 and evaporated particles on the way of returning to the first electron return electrode 2A, and they are diffused in the vacuum chamber 12 along the magnetic field formed by the converging coil 18 without returning to the first electron return electrode 2A. It was also found out that the diffused electrons scatter to a space portion not only at a side of a vertical extending through the deposition material 20, remote from the plasma gun 11, but nearer to the substrate 13 than the deposition material 20 between the deposition material 20 and the substrate 13. Considering these results, in the aforementioned vacuum coating forming device, the second electron return electrode 2B in addition to the first electron return electrode 2A is provided. As a result, the ratio of a current returning to both the first electron return electrode 2A and the second electron return electrode 2B to the effective discharge current has become a value over 90% and close to 100%, so that the coating forming rate has also been improved.

Figure 13:
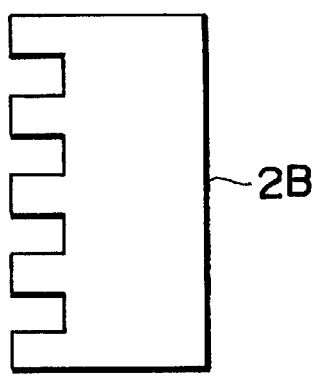
FIG. 13 is a side view of a second electron return e of a vacuum coating forming device according to an eleventh embodiment of the present invention.

FIG. 13 shows a second electron return electrode 2B of a vacuum coating forming device according to an eleventh embodiment of the present invention. Other parts of this vacuum coating forming device except this second electron return electrode 2B is substantially identical with those of the device shown in FIG. 12.

In this embodiment, the surface of the second electron return electrode 2B on the plasma beam 22 side is formed into a corrugated shape, so that the surface area of the surface to which electrons reflected by the hearth 19 return is increased.

By such an arrangement, the ratio of the current by return electrons from the plasma beam 22 irradiated to the deposition material 20 is increased.

Figure 14:
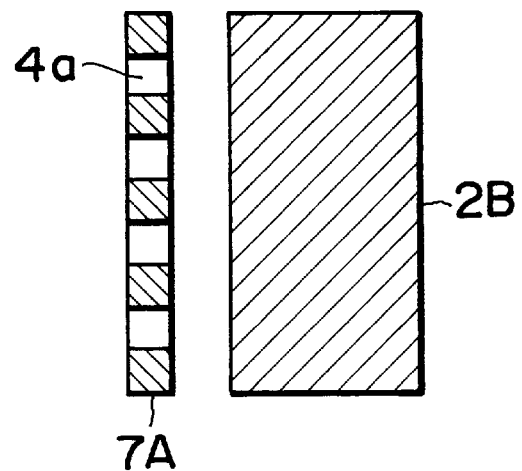
FIG. 14 is a sectional view showing a second electron return electrode and a baffle plate in a vacuum coating forming device according to a twelfth embodiment of the present invention.

FIG. 14 shows a second electron return electrode 2B of a vacuum coating forming device according to a twelfth embodiment of the present invention. Except for this portion, other parts in this vacuum coating forming device are substantially identical with those of the device shown in FIG. 12.

In this embodiment, on the plasma beam 22 side of the second electron return electrode 2B, a baffle plate 7 having a number of through-holes 4a are juxtaposed at a distance from the second electron return electrode 4a.

By such an arrangement, the amount of insulating material evaporated from the insulating deposition material 20 and reaching the second electron return electrode 2B is decreased, thereby preventing the formation of an insulating coating on the second electron return electrode 2B. This makes it possible to improve the aforementioned ratio.

Figure 15:
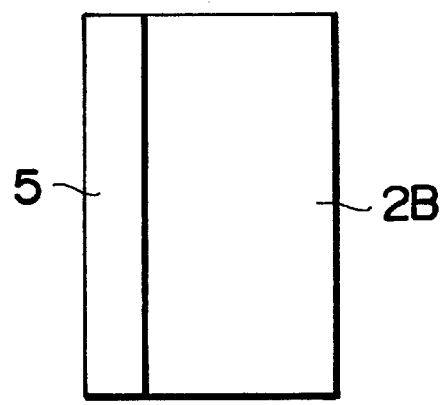
FIG. 15 is a side view showing a second electron return electrode and a wiper in a vacuum coating forming device according to a thirteenth embodiment of the present invention.
Figure 16:
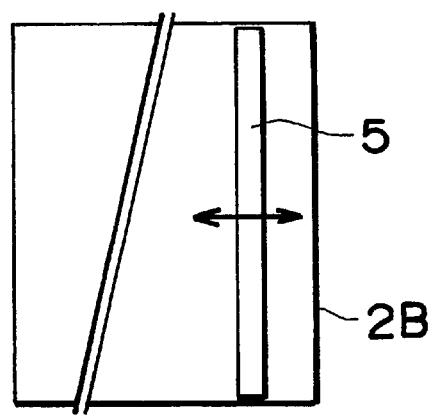
FIG. 16 is a view of the second electron return electrode of FIG. 15, as viewed from the front side.

FIGS. 15 and 16 show a second electron return electrode 2B and its vicinities of a vacuum coating forming device according to a thirteenth embodiment of the present invention. Except for this portion, other parts in this vacuum coating forming device are substantially identical with those of the device shown in FIG. 12.

In this embodiment, a wiper 5 that slides along the surface of the second electron return electrode 2B confronting the plasma beam 22 is provided, by which depositions on the surface can forcibly be scraped away.

As a result, the formation of an insulating coating on the surface of the second electron return electrode 2B can be prevented so that the aforementioned ratio can be improved.

Figure 17:
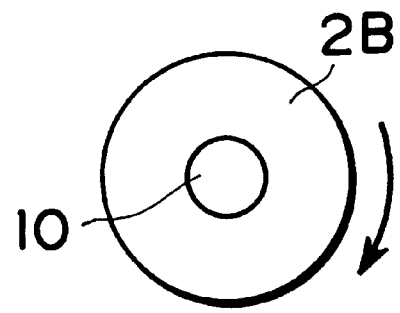
FIG. 17 is a side view of a second electron return electrode of a vacuum coating forming device according to a fourteenth embodiment of the present invention.

FIG. 17 shows a second electron return electrode 2B of a vacuum coating forming device according to a fourteenth embodiment of the present invention. Except for this portion, other parts of this vacuum coating forming device are substantially identical with those of the vacuum coating forming device shown in FIG. 12.

In this embodiment, the second electron return electrode 2B, which is a circular cylindrical body, is formed so as to be rotatable around, and integrally with, a rotary shaft 10 extending laterally, so that the whole surface of the second electron return electrode 2B can be effectively used.

As a result, the ratio of the current by the return electrons from the plasma beam 22 irradiated onto the deposition material 20 can be improved.

A surface of this cylindrical-shaped second electron return electrode 2B on a side distant from both the plasma beam 22 and the substrate 13, and an unshown fixed wiper extending parallel to the rotary shaft 10 are brought into contact with each other so as to be slidable relative to each other, so that depositions on the surface are eliminated. Thus, the aforementioned ratio can be further improved.

Figure 18:
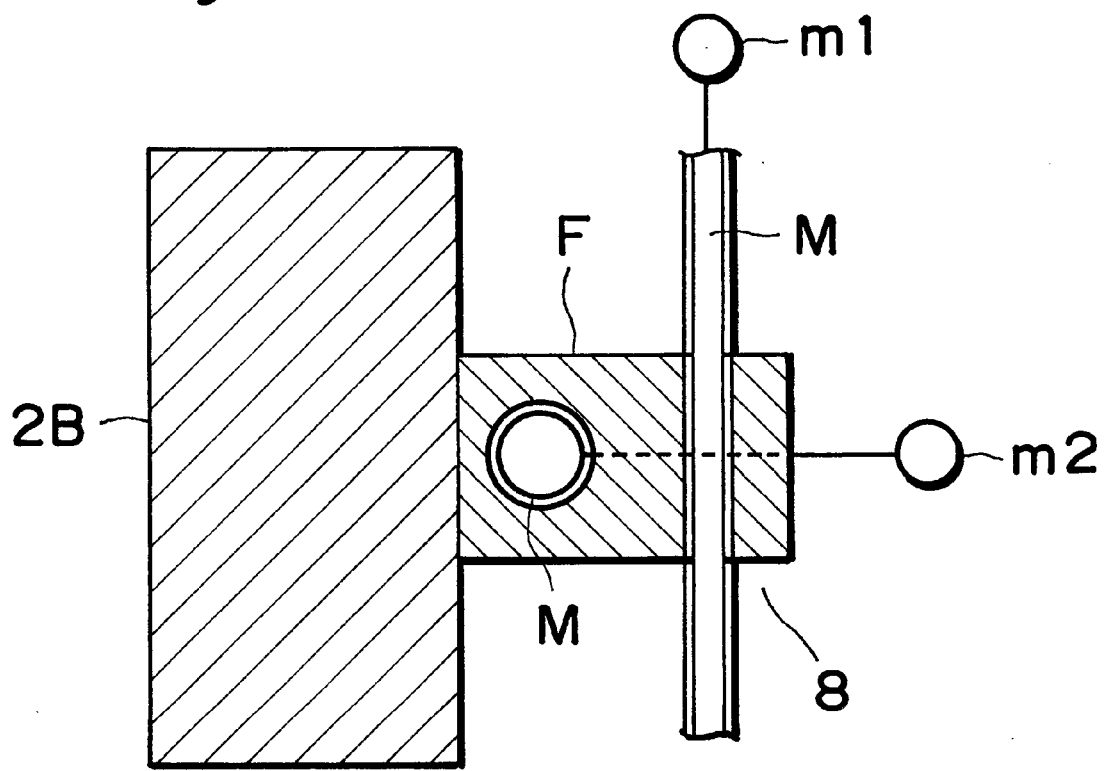
FIG. 18 shows a second electron return electrode and its support portion in a vacuum coating forming device according to a fifteenth embodiment of the present invention.

FIG. 18 shows a second electron return electrode 2B of a vacuum coating forming device according to a fifteenth embodiment of the present invention. Except for this portion, other parts of this vacuum coating forming device are substantially identical with those of the vacuum coating forming device shown in FIG. 12.

In this embodiment, the second electron return electrode 2B is supported movably in lateral direction and longitudinal direction by a ball screw 8. This ball screw 8 comprises a female screw portion F and two male screw portions M. The female screw portion F being attached to a surface of the ball screw 8 on a side opposite to the side confronting the plasma beam 22. Each of the two male screw portions M is screwed into each of two female screws formed perpendicularly to each other in two directions and, extends laterally and longitudinally so as to be rotated normally and reversely by motors m1, m2.

As a result, when the state of the magnetic field controlling the plasma beam 22 is changed, or when process conditions are altered, the second electron return electrode 2B is shifted to a position corresponding to this change or alteration, thus making it possible to improve the aforementioned ratio.

Figure 19:
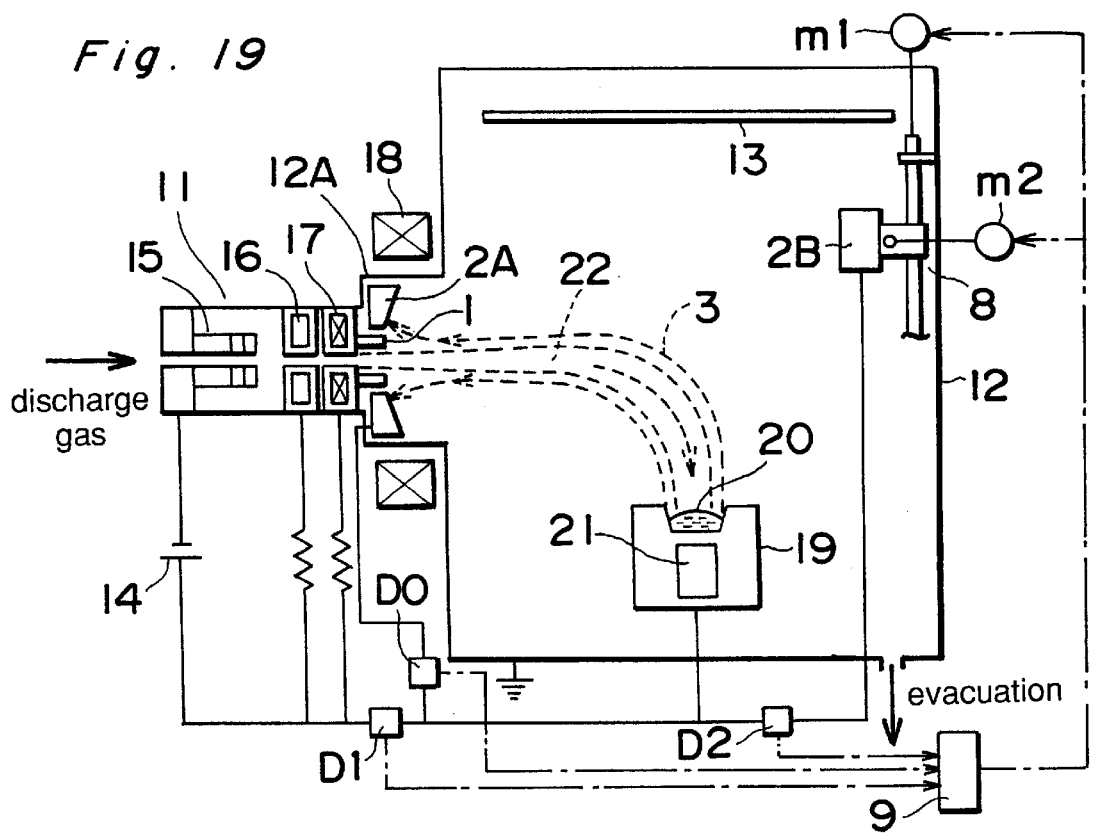
FIG. 19 schematically shows a vacuum coating forming device employing an ion plating system according to a sixteenth embodiment of the present invention.

FIG. 19 shows a vacuum coating forming device according to a sixteenth embodiment of the present invention. In FIG. 19, parts common to those of FIG. 12 are designated by the same reference numerals and their description is abbreviated.

In this embodiment, the second electron return electrode 2B is supported by the aforementioned ball screw 8 so as to be movable laterally and longitudinally.

Furthermore, a first current detector D1 for detecting a first electron return current by electrons having returned to the first electron return electrode 2A, and a second current detector D2 for detecting a second electron return current by electrons having reached to the second electron return electrode 2B are provided. In this case, the vacuum chamber 12 is grounded. There is further provided a controller 9 actuating the motors m to move the second electron return electrode 2B so that, upon receiving current signals from the first current detector D1 and the second current detector D2, the sum of the currents flowing through the first electron return electrode 2A and the second electron return electrode 2B, respectively, becomes a maximum and that the current flowing on the ground side becomes zero.

This controller 9 controls the motors m1, m2 through steps of moving the second electron return electrode 2B in the state that the plasma beam 22 has been generated under predetermined process conditions, storing data representing the relationship between a position of second electron return electrode 2B and a sum of currents flowing each of the two electrodes, determining based on the stored data a position where the sum of the currents flowing each of the two electrodes becomes maximum, and moving the second electron return electrode 2B to the determined position.

Alternatively, it is also possible to control the motors m1, m2 through the steps of constantly computing a position where the sum of currents flowing through each of the two electrodes becomes maximum or determining the position by fuzzy reasoning or the like, and moving the second electron return electrode 2B to the resultant position.

By such an arrangement, in this device, in which current detectors are provided, the position where the sum of currents by return electrons can be determined easily and in short time, thus making it possible to constantly maintain an optimal state with regard to the improvement in the aforementioned ratio.

In addition, although the deposition material 20 is an electrically insulating material in general, it may be an electrically conductive substance if the material combines with reactive gas to change into an electrically insulating material. However, if the deposition material 20 is an electrically insulating material, it is necessary to electrically shield the hearth 19 and the discharge power supply 14 from each other until the deposition material 20 is changed into an electrically insulating material. In contrast to this, if the deposition material 20 is an electrically insulating material by nature, it is not necessary to shield the hearth 19 and the discharge power supply 14 from each other.

The substrate 13 is permitted to keep stationary or rotating or horizontally moving during the coating formation process. In addition, if the substrate 13 is kept in a state of a flat plate in the vacuum chamber 12, the substrate 13 may be provided as a film wound around rolls so as to be unwound by one roll and wound by the other roll.

Needless to say, the second electron return electrode 2B may be applied not only to vacuum coating forming devices of the ion plating system but also vacuum coating forming devices of the plasma enhanced CVD system.

What is claimed is:

1. A vacuum coating forming device for forming a thin-film coating by a plasma beam on a substrate arranged in a vacuum chamber, the vacuum coating forming device comprising: a pressure gradient type plasma gun for generating a plasma beam toward an inside of a vacuum chamber; and a converging coil which is provided so as to surround a short-tube portion of the vacuum chamber projecting toward an outlet of the plasma gun and which reduces a cross section of the plasma beam, characterized by further comprising: an insulating tube provided in the short-tube portion so as to surround the plasma beam and project in electric floating state, and an electron return electrode which surrounds the plasma beam via the insulating tube within the short-tube portion and which is higher in electric potential than the outlet.

2. The vacuum coating forming device according to claim 1, wherein the electron return electrode is provided with a wiper which slides along a surface of the electron return electrode on a side opposite to a plasma gun side so as to remove depositions on the surface.

3. The vacuum coating forming device according to claim 2, wherein the electron return electrode has a water cooling structure.

4. The vacuum coating forming device according to claim 1, wherein the surface of the electron return electrode on a side opposite to the plasma gun side is formed into a corrugated shape.

5. The vacuum coating forming device according to claim 4, wherein the electron return electrode has a water cooling structure.

6. The vacuum coating forming device according to claim 1, wherein a number of through-hole portions are dispersedly formed uniformly all over an opening portion of the short-tube portion, and a baffle plate having an aperture for the plasma beam at a center portion thereof is provided so as to cross the plasma beam.

7. The vacuum coating forming device according to claim 6, wherein the electron return electrode has a water cooling structure.

8. The vacuum coating forming device according to claim 6, wherein the baffle plate has a water cooling structure.

9. The vacuum coating forming device according to claim 1, wherein the electron return electrode has a water cooling structure.

10. A vacuum coating forming device for forming a thin-film coating by a plasma beam on a substrate arranged in a vacuum chamber, the vacuum coating forming device comprising: a pressure gradient type plasma gun for generating a plasma beam toward an inside of a vacuum chamber, and a converging coil which is provided so as to surround a short-tube portion of the vacuum chamber projecting toward an outlet of the plasma gun and which reduces a cross section of the plasma beam, characterized by further comprising: an insulating tube provided in the short-tube portion so as to surround the plasma beam and project in electric floating state; a first electron return electrode which surrounds the insulating tube within the short-tube portion and which is higher in electric potential than the outlet; and a second electron return electrode which is provided in a space distant from the plasma beam and which is equal in electric potential to the first electron return electrode.

11. The vacuum coating forming device according to claim 10, further comprising: a driving section for moving the second electron return electrode at least laterally; an effective discharge current detector for detecting a current passed to generate the plasma beam; a first current detector and a second current detector for detecting currents flowing through the first electron return electrode and the second electron return electrode, respectively; and a controller for, upon receiving current signals from the detectors, operating the driving section so as to move the second electron return electrode to a position where a sum of the currents flowing through the first electron return electrode and the second electron return electrode, respectively, becomes maximum.

* * * * *